US011862619B2

United States Patent
Pietambaram et al.

(10) Patent No.: US 11,862,619 B2
(45) Date of Patent: Jan. 2, 2024

(54) PATCH ACCOMMODATING EMBEDDED DIES HAVING DIFFERENT THICKNESSES

(71) Applicant: Intel Corporation, Santa Clara, CA (US)

(72) Inventors: Srinivas Pietambaram, Gilbert, AZ (US); Robert Alan May, Chandler, AZ (US); Kristof Darmawikarta, Chandler, AZ (US); Hiroki Tanaka, Chandler, AZ (US); Rahul N. Manepalli, Chandler, AZ (US); Sri Ranga Sai Boyapati, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/649,923

(22) PCT Filed: Dec. 29, 2017

(86) PCT No.: PCT/US2017/069060
§ 371 (c)(1),
(2) Date: Mar. 23, 2020

(87) PCT Pub. No.: WO2019/132992
PCT Pub. Date: Jul. 4, 2019

(65) Prior Publication Data
US 2020/0266184 A1    Aug. 20, 2020

(51) Int. Cl.
*H01L 23/498* (2006.01)
*H01L 23/538* (2006.01)
(Continued)

(52) U.S. Cl.
CPC ............ *H01L 25/50* (2013.01); *H01L 21/486* (2013.01); *H01L 23/49816* (2013.01);
(Continued)

(58) Field of Classification Search
CPC .............. H01L 25/50; H01L 23/49816; H01L 23/5389; H01L 25/0652
See application file for complete search history.

(56) References Cited

U.S. PATENT DOCUMENTS

| | | | |
|---|---|---|---|
| 10,930,601 B2* | 2/2021 | Iyer | H01L 23/5386 |
| 2008/0315377 A1* | 12/2008 | Eichelberger | H01L 23/5389 257/660 |

(Continued)

FOREIGN PATENT DOCUMENTS

| KR | 2013 0132162 | 12/2013 |
|---|---|---|
| KR | 1020190093193 | 8/2019 |

(Continued)

OTHER PUBLICATIONS

International Search Report and Written Opinion for International Patent Application No. PCT/US2017/069060 dated Sep. 27, 2018, 9 pgs.

(Continued)

*Primary Examiner* — Phat X Cao
(74) *Attorney, Agent, or Firm* — Schwabe, Williamson & Wyatt, P.C.

(57) ABSTRACT

Techniques for a patch to couple one or more surface dies to an interposer or motherboard are provided. In an example, the patch can include multiple embedded dies. In an example, a microelectronic device can be formed to include a patch on an interposer, where the patch can include multiple embedded dies and each die can have a different thickness.

24 Claims, 15 Drawing Sheets

(51) Int. Cl.
  *H01L 25/065* (2023.01)
  *H01L 25/00* (2006.01)
  *H01L 21/48* (2006.01)
  *H01L 23/00* (2006.01)
(52) U.S. Cl.
  CPC .... *H01L 23/49866* (2013.01); *H01L 23/5385* (2013.01); *H01L 23/5389* (2013.01); *H01L 25/0652* (2013.01); *H01L 24/14* (2013.01); *H01L 2224/1403* (2013.01)

(56) References Cited

U.S. PATENT DOCUMENTS

| | | | | |
|---|---|---|---|---|
| 2010/0032827 | A1* | 2/2010 | Hsu | H01L 23/5384 |
| | | | | 257/692 |
| 2011/0248397 | A1 | 10/2011 | Coffy et al. | |
| 2011/0316140 | A1* | 12/2011 | Nalla | H01L 23/481 |
| | | | | 257/698 |
| 2014/0103488 | A1* | 4/2014 | Chen | H01L 24/19 |
| | | | | 257/532 |
| 2014/0248742 | A1 | 9/2014 | Gonzalez et al. | |
| 2014/0299999 | A1* | 10/2014 | Hu | H01L 24/19 |
| | | | | 257/774 |
| 2016/0196988 | A1 | 7/2016 | Sankman et al. | |
| 2016/0260695 | A1* | 9/2016 | Chung | H01L 25/18 |
| 2017/0301625 | A1 | 10/2017 | Mahajan et al. | |
| 2018/0358298 | A1* | 12/2018 | Zhai | H01L 23/16 |

FOREIGN PATENT DOCUMENTS

| WO | WO 2013/065895 | 5/2013 |
|---|---|---|
| WO | WO 2017/078709 | 5/2017 |
| WO | WO-2017-111957 | 6/2017 |

OTHER PUBLICATIONS

Search Report from European Patent Application No. 17936282.7, dated Jul. 13, 2021, 13 pgs.
Search Report from European Patent Application No. 17936282.7, dated Dec. 13, 2021, 19 pgs.
Office Action from Korean Patent Application No. 10-2020-7014878, dated Mar. 13, 2023, 10 pgs.
Search Report from Malaysian Patent Application No. PI2020001744, dated Oct. 12, 2022, 2 pgs.
Notice of Allowance from Korean Patent Application No. 10-2020-7014878, dated Sep. 18, 2023, 5 pgs.

* cited by examiner

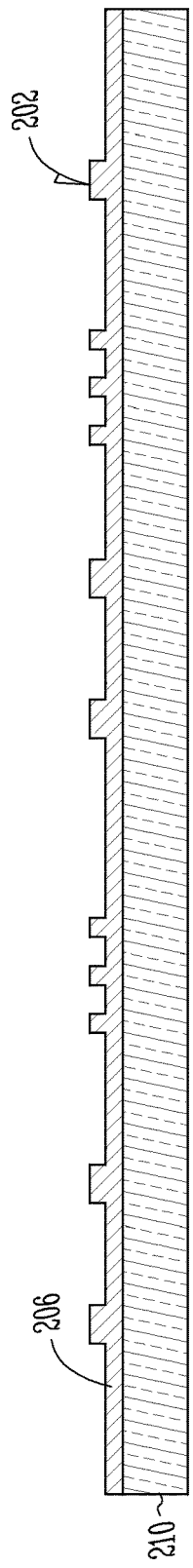
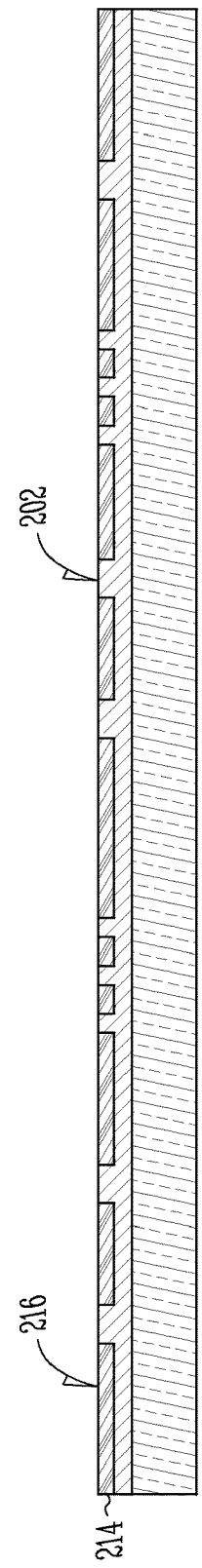

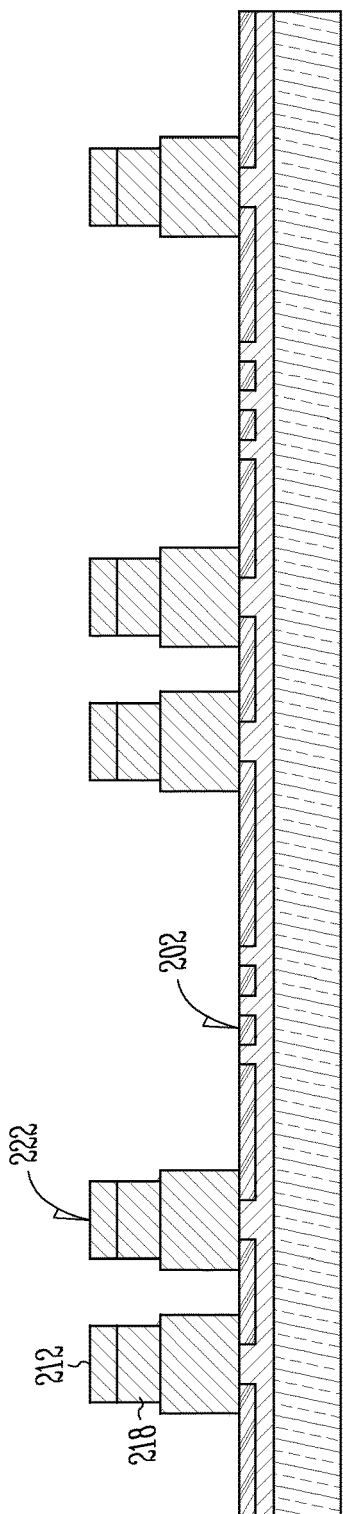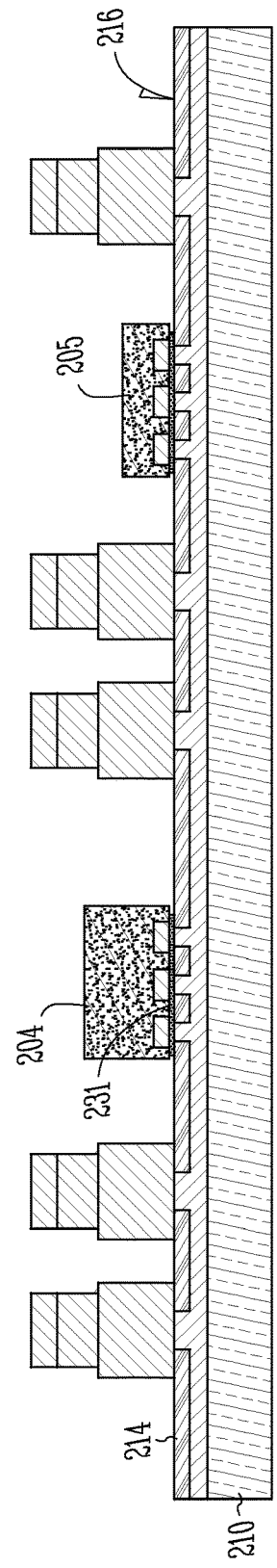

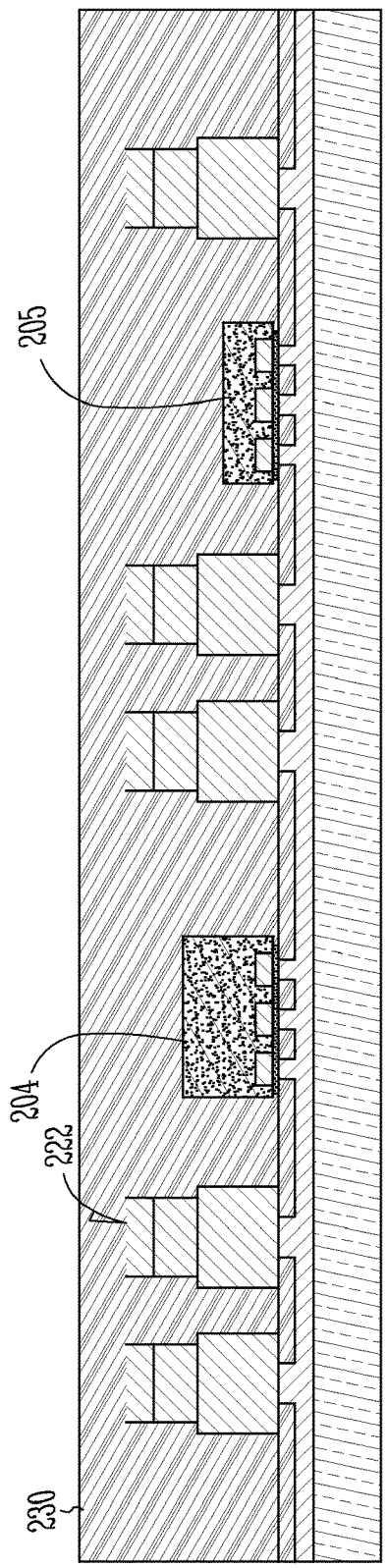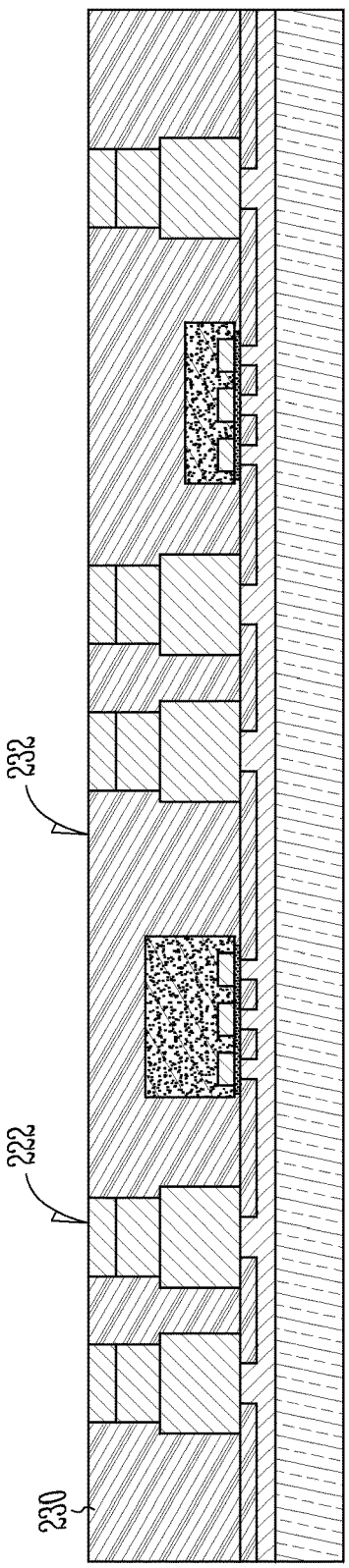

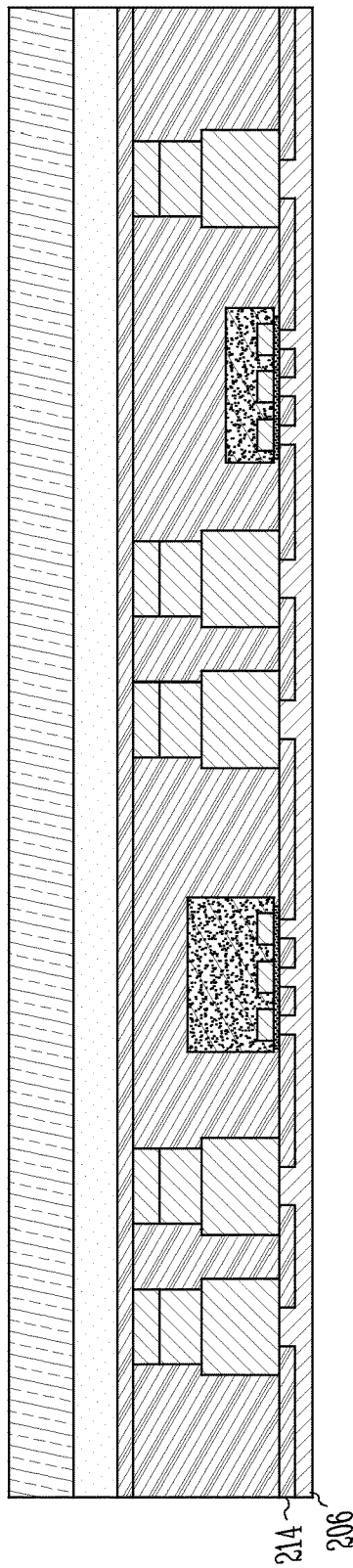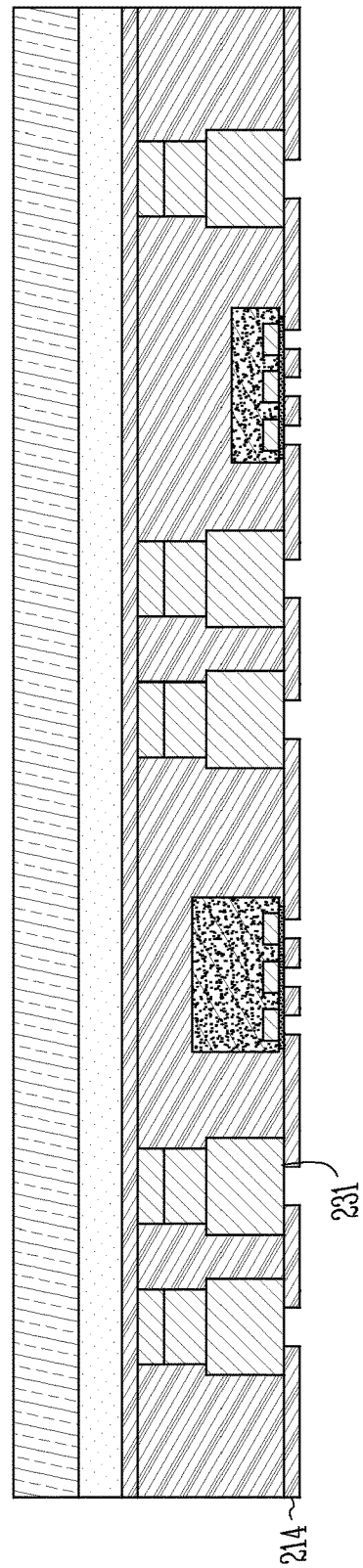

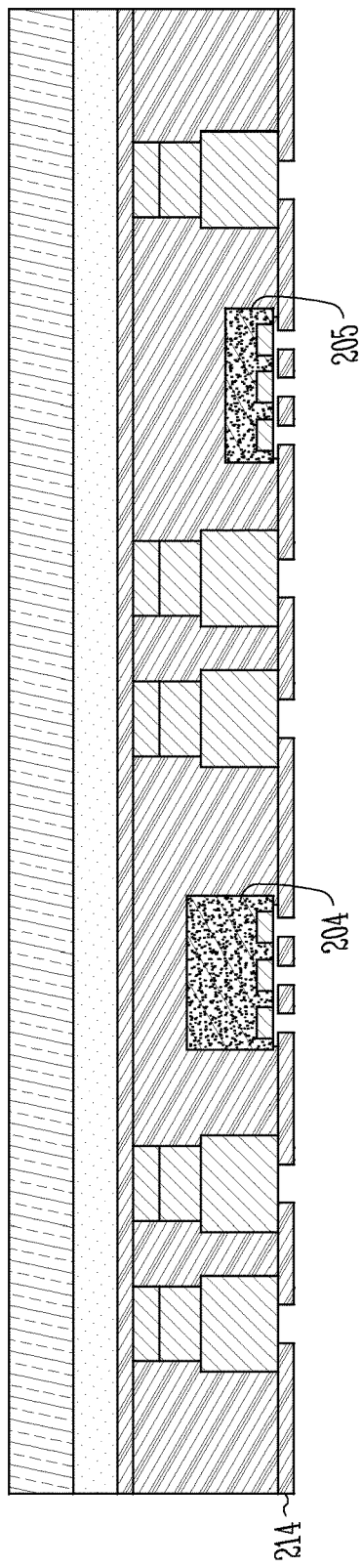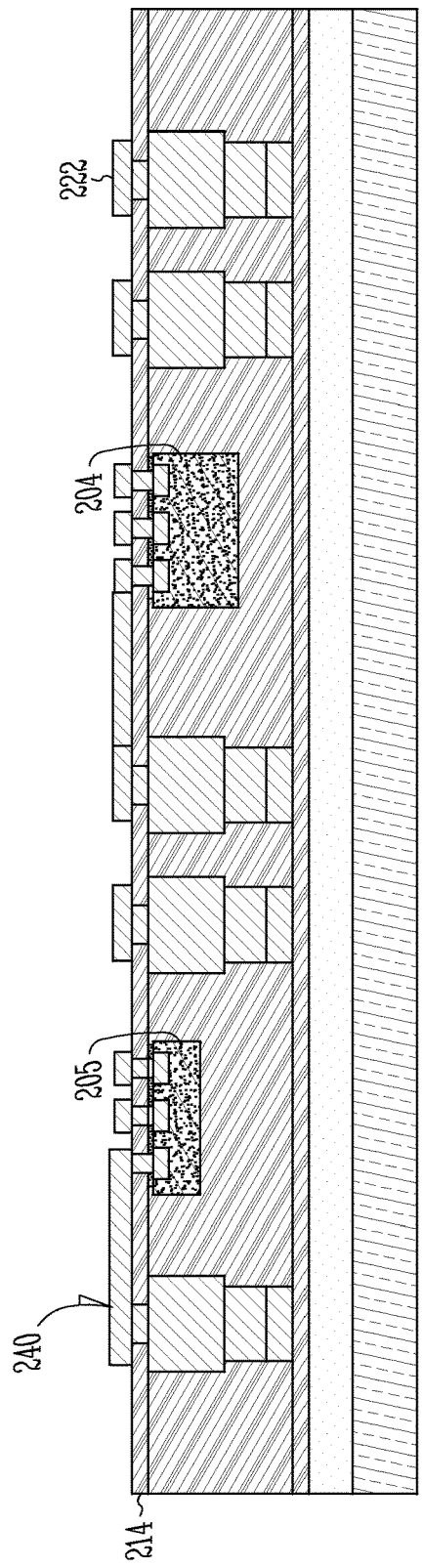

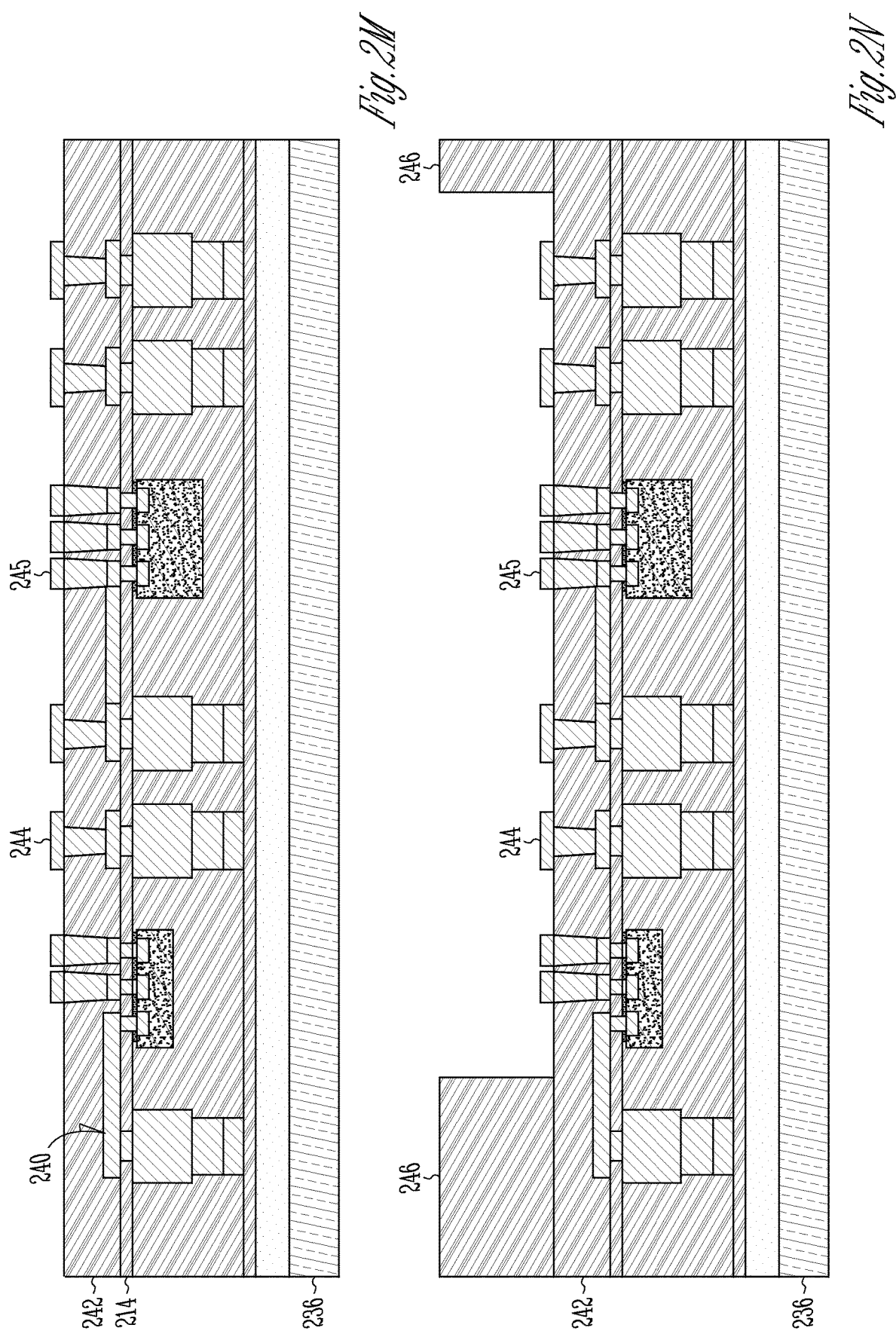

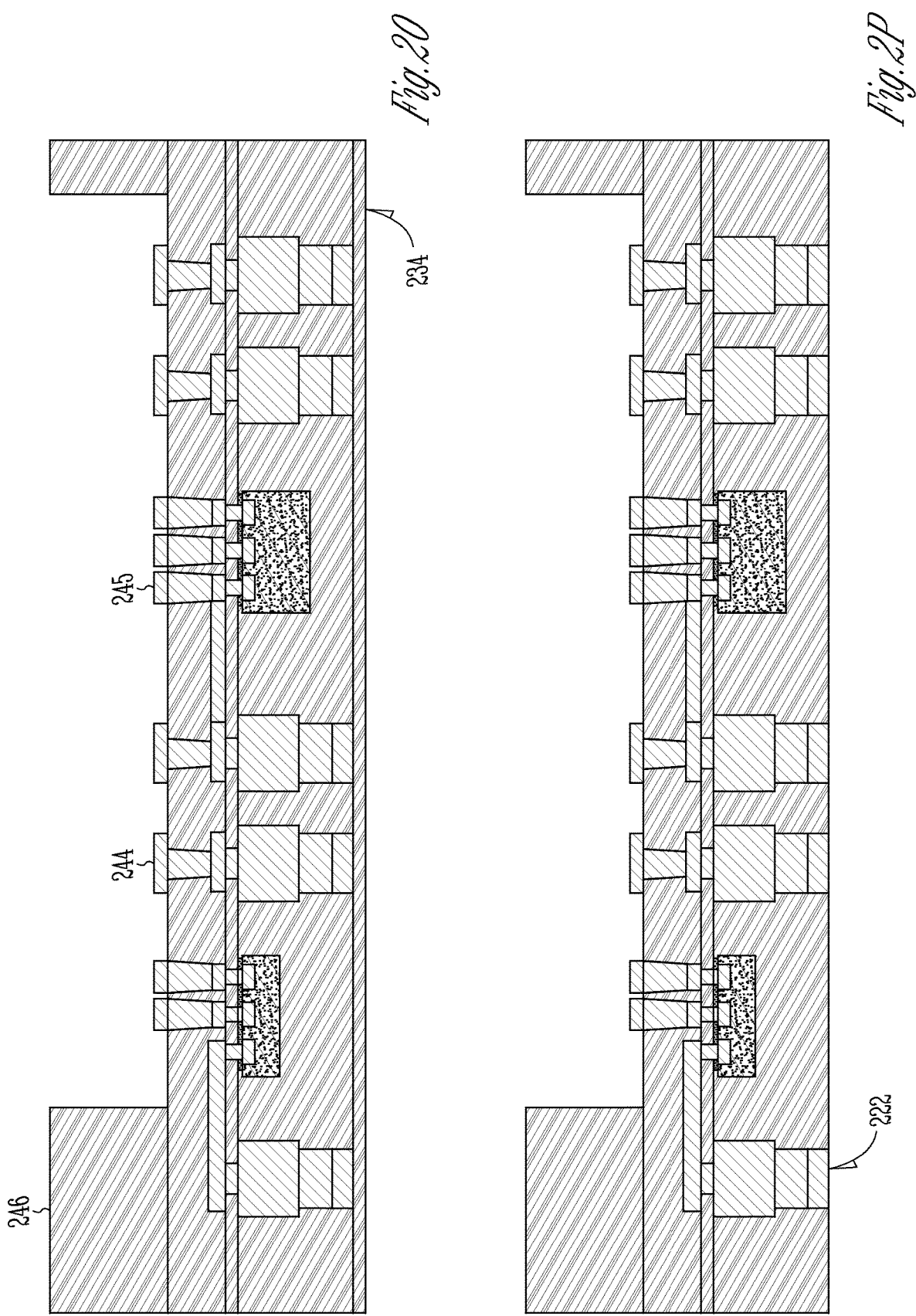

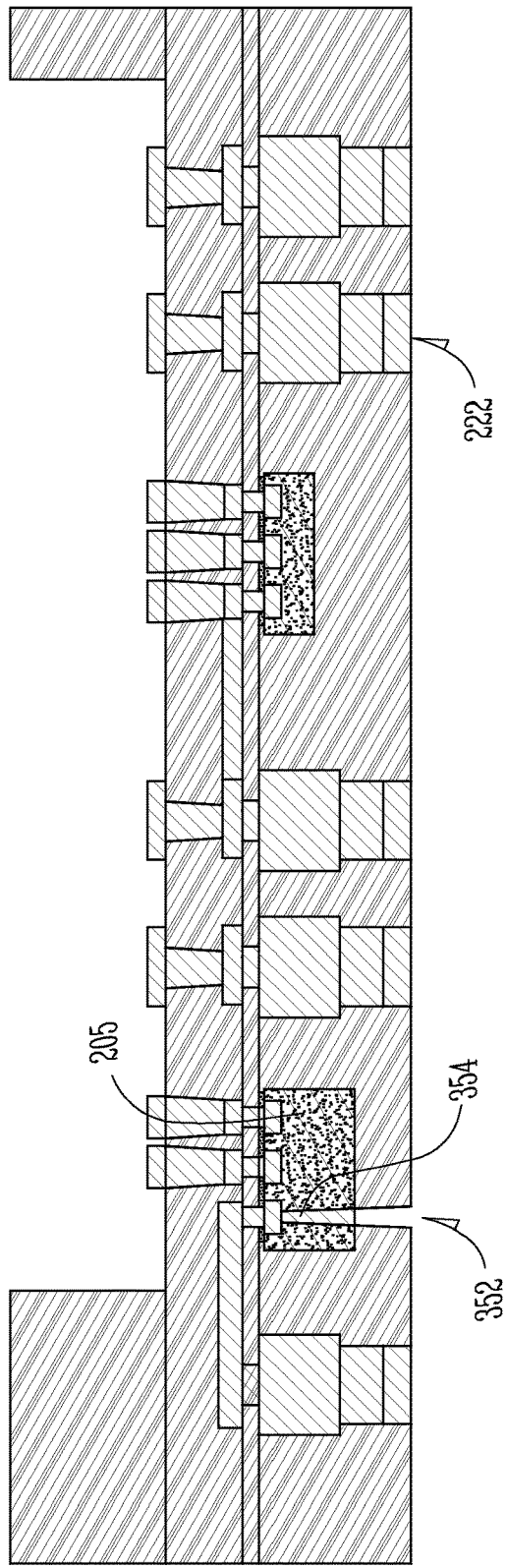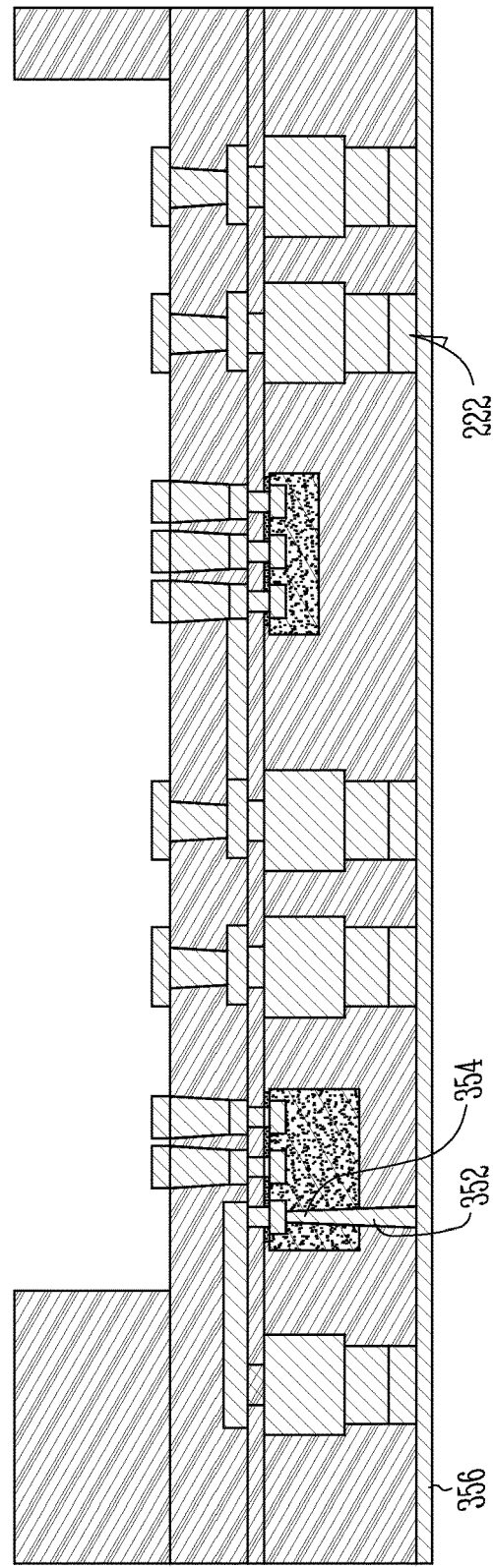

PATCH ACCOMMODATING EMBEDDED DIES HAVING DIFFERENT THICKNESSES

CROSS-REFERENCE TO RELATED APPLICATION

This patent application is a U.S. National Phase Application under 35 U.S.C. § 371 of International Application No. PCT/US2017/069060, filed Dec. 29, 2017, entitled "PATCH ACCOMODATING EMBEDDED DIES HAVING DIFFERENT THICKNESSES," which designates the United States of America, the entire disclosure of which is hereby incorporated by reference in its entirety and for all purposes.

TECHNICAL FIELD

Embodiments described herein relate generally to methods and apparatus for forming microelectronic devices including patches, and components thereof; and more particularly relate to methods and apparatus for forming and providing patches with embedded die of varying thickness and low Bump Top Variation (BTV).

BACKGROUND

Many forms of microelectronic devices, such as IC (integrated circuit) packages, include a substrate supporting one or more devices (referred to herein as "die"), embedded within the substrate (e.g., retained at least partially beneath a surface of the substrate). In many examples, such microelectronic devices may have one or more semiconductor die coupled above the surface of the substrate. The embedded die can be of various configurations. For example, in some example applications the embedded die may be a "passive" component, providing only conductive pathways (referred to herein as a "bridge" die) and in other example applications the embedded die may be an "active" die, containing additional electrical circuit elements, as discussed later herein.

The embedding of a die within a substrate of a microelectronic device, whether a bridge die or an active die, provides many advantages. However, conventional processes used to manufacture such substrates can be prone to inconsistencies, leading to either yield losses for the substrates or complications in integrating the substrates with other structures (such as surface die). For example, conventional processes for forming an embedded die substrate typically define multiple transverse routing layers within the substrate, and are typically formed through use of a buildup process, such as, for example, a vacuum lamination process. In such conventional build up processes multiple layers of dielectric are successively laminated over respective routing layers, often formed by a semi-additive process (SAP) of metallization (such as plated copper). Such substrates formed through a buildup process over these metal transverse routing layers can result in variations in solder bump height (top) or BTV. The limitations of substrates formed through this process are further exacerbated by embedding of multiple die within the substrate, since the die may have different thicknesses (e.g., in the vertical or Z-dimension). Both types of variation become more problematic as bump pitch scaling is reduced. Thus, the limitations experienced with conventional processes discussed above are expected to become increasingly problematic for future devices.

BRIEF DESCRIPTION OF THE DRAWINGS

FIGS. 3A-3D illustrate an alternative simplified schematic representations of sequential representative stages of an example process for forming an example substrate.

DESCRIPTION OF EMBODIMENTS

Figure 1A:
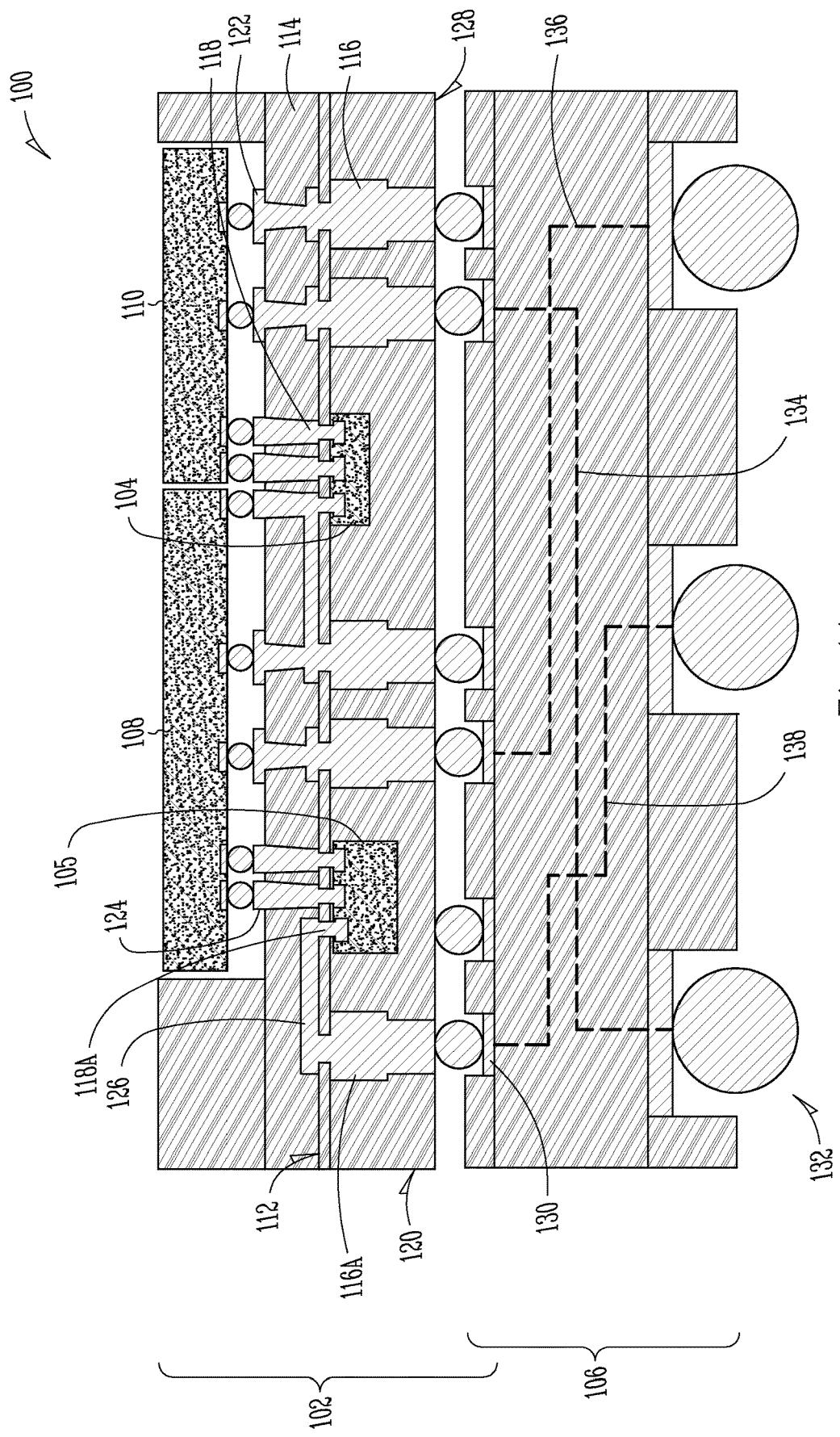
FIG. 1A illustrates generally a simplified schematic representation of an example configuration of a microelectronic device including an example patch.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The present description addresses example embodiments of a novel microelectronic device including a patch. Example patches can include multiple embedded dies. Each of the embedded dies can have a thickness different that the other embedded dies. In certain examples, the example patch can facilitate electrical connection of multiple surface die with an interposer/substrate that can connect the surface die to a motherboard, for example. The present description also addresses example embodiments of processes for manufacturing such a patch, as well as electronic systems incorporating the novel patch. In some examples as described herein, the patch houses one or more embedded die particularly suitable for improved yield in manufacturing. In many examples, the patch includes vertical contacts extending through a dielectric of the patch.

In many examples, the patch may further include contacts extending from one or more surfaces to the one or more embedded die. The can be formed to include no more than a single transverse (i.e., in the lateral/horizontal direction) routing layer (i.e., a single layer containing one or more transverse routing traces). In some examples, conductive structures in the patch may be either vertical contacts extending completely through the patch or vertical contacts extending from either an upper surface or a lower surface to an embedded die. In other examples, a single transverse routing layer may be provided proximate an upper surface of the patch (either within the structure of the patch or disposed on a surface of the patch), proximate a lower surface of the patch (for example, in a lower metallization layer of the patch), or intermediate the patch (vertically offset from both the upper and lower surfaces of the substrate).

The embedded die can be of various configurations. For example, in some examples the embedded die may be a "passive" component, providing only conductive pathways (referred to herein as a "bridge" die). In many such examples, such a bridge die may be used to provide interconnections between two or more surface semiconductor die secured above a surface of the patch (termed herein, "surface die").

In other example applications, the embedded die may include active circuit components beyond simple conductive interconnects. Such a die with active circuit components can include circuitry ranging from including relatively simple circuits (such as, for example, filters, voltage limiters, and the like), to much more complex circuits including, for example transistors, fuses or anti-fuses, and/or other programmable elements (such as programmable logic devices (PLMs), field programmable logic arrays (FPGAs), etc.), and/or processing (instruction executing) capabilities. For purposes of the present description, the terminology of a "bridge" die will be used for any die having only interconnect structures providing circuit pathways; and the terminology of an "active" die will be used for any die having circuit devices beyond those of a bridge die. Additionally, the current description uses the term "embedded die" to refer to a die which is, or will be, upon completion of the patch, embedded within the patch.

In some examples, transverse redistribution/routing layers can be eliminated from the patch substrate, such that the patch substrate includes no more than a single transverse routing layer. In some examples, the patch can include multiple routing layers. In many examples, the patch can be coupled directly to the interposer through appropriate contact structures. The described structure with a single transverse routing layer can simplify manufacturing of the patch, thereby improving the potential yield of the patches. Additionally, as described later herein, the patches may be manufactured through a process offering improved dimensional control. Such dimensional control can assist in providing a bump top variation (BTV) of less than 10 microns and, in certain examples, less than 5 microns. Additionally, future generations of microelectronic devices are calling for much higher levels of heterogeneous integration. This higher level of heterogeneous integration may call for multiple die to be connected using a bridge die embedded in the substrate. To accommodate higher connections, a great number of die may need to be embedded in the substrate. The present subject matter can accommodate such higher level integration while also maintaining high yields by reducing BTV rejections.

The interposer may be constructed in a conventional manner as is known to persons skilled in the art. In many examples, many of the contact pads or other contact structures at the upper and lower surfaces of the interposer may be at relatively wider pitches that at least some of the vertical vias in the patch (such as, for example, some vertical vias in the substrate extending to embedded die in the substrate).

Referring now to the drawings in more detail, and particularly to FIG. 1A, the figure depicts a simplified schematic representation of an example configuration of a microelectronic device 100 demonstrating the construction discussed above. Microelectronic device 100 includes a patch, indicated generally at 102, housing a first embedded die 104 and a second embedded die 105. In certain examples, the first embedded die can have a different thickness than the second embedded die 105. Patch 102 is secured to an interposer, indicated generally at 106. A first surface die 108 and a second surface die 110 are coupled over a first surface 112 of patch 102.

Patch 102 further includes first and second groups of vertical contacts, indicated at 116 and 118, respectively, extending within a dielectric body, indicated generally at 120. The first group of vertical contacts 116 form through contacts extending through the entire dimension of dielectric body 120; while vertical contacts 118 can extend to engage one of the embedded dies 104, 105. As will be discussed in more detail relative to FIGS. 2A-2R, patch 102 may include one or more types of dielectric material, such as, for example, any one or more of polyimide, polyamide, and epoxy resin (commonly with a filler, such as a silica filler, such as, for example, the epoxy resin sold under the trade name "Ajinomoto Build-up Film" (ABF)), as well as other dielectrics known to persons skilled in the art. Additionally, the dielectric material may be formed around the embedded dies 104 105. In some examples, the dielectric material and the conductive material of the first and second groups of vertical contacts 116, 118 (or only a single group of contacts in some examples) may both be formed (at least in part) in multiple layers of such materials.

Due in part to the greater vertical dimension of the first group of vertical contacts 116, at least a portion of this group of contacts are arranged at a wider pitch relative to one another than are contacts 118. In the depicted example, an insulative layer 114, such as solder resist, is placed over the first surface 112 of patch 102, and contact pads, as indicated generally at 122 and 124, extend through insulative layer 114 to engage vertical contacts 116 and 118, respectively. In other examples, the solder resist or other insulative layer 114 may be omitted, and a different configuration of contact structure may be utilized to facilitate electrical and mechanical coupling of one or more surface die 108, 110 directly to patch 102.

Patch 102 includes an optional transverse routing trace 126, extending transversely to redistribute signals between two laterally offset vertical locations (in the depicted illustrative example, extending between the vertical contact 118(A) extending to embedded die 104 and a vertical contact 116(A). Though a couple transverse routing traces 126 are depicted; persons skilled in the art will recognize that when such a layer is present, multiple routing traces may be formed in the layer to form connections between respective laterally offset locations. In the depicted example, the optional transverse routing trace 126 is formed in a layer at upper surface 112 of patch 102. In other examples, the transverse routing layer may be formed internal to patch 102 (i.e. at some location between a surface 112 and lower surface of patch 102).

Interposer 106 is coupled to patch 102 to electrically communicate therewith. In the present example, interposer 106 may be configured to serve the function of a package substrate for microelectronic device 100. As result, interposer 106 may be configured to provide a desired interconnect routing between patch 102 (and potentially devices coupled thereto, such as surface die 108, 110) and structures external to microelectronic device 100.

Interposer 106 provides upper contacts, indicated generally at 130, and lower contacts, indicated generally at 132, and provides electrical interface routing between the upper and lower contacts 130, 132. Appropriate layers of transverse redistribution structures (for example, three layers of transverse redistribution of traces are schematically represented 134, 136, and 138) facilitate the redistribution. The example transverse redistribution of traces of each level may be connected directly to an adjacent level or to another vertically offset location) by vertical interconnects (such as micro-vias, or analogous structures, as known to persons skilled in the art). In some examples, interposer 106 may include one or more layers formed of one or more insulating layers, such as glass-reinforced epoxy (such as FR-4), polytetrafluoroethylene (Teflon), cotton-paper reinforced epoxy (CEM-3), phenolic-glass (G3), paper-phenolic (FR-1 or FR-2), polyester-glass (CEM-5), as well as many other example dielectric materials, and combinations of the above. In many examples, interposer 106 may be formed through a buildup process, either on a core or in a coreless configuration; and a micro via formation process, such as laser drilling, followed by metal fill, can be used to form interconnections between conductive layers in the buildup and die bond pads.

Figure 1B:
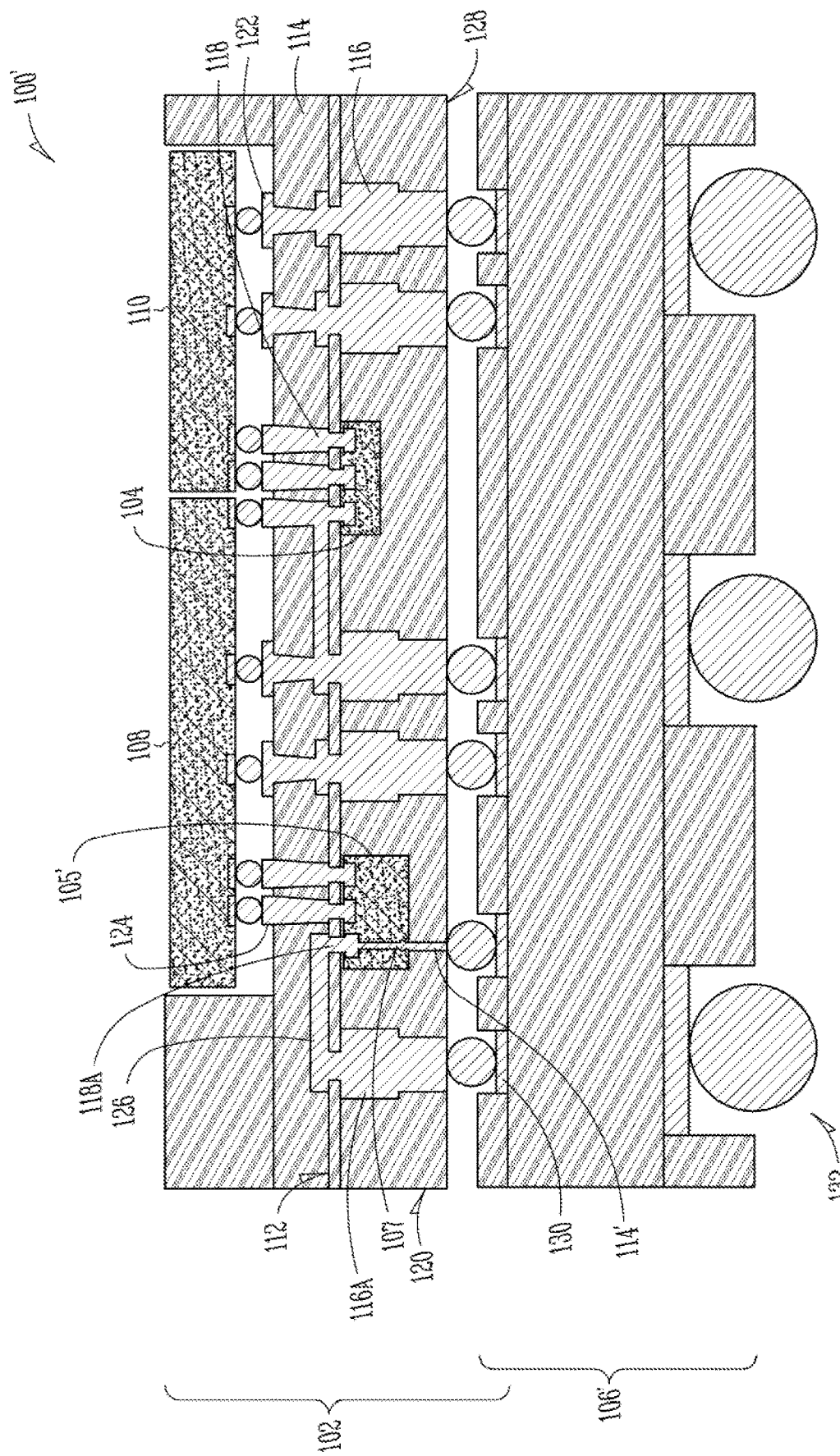
FIG. 1B illustrates generally a simplified cross section of a schematic representation of an alternative embodiment of a microelectronic device having an example patch 102.

FIG. 1B illustrates generally a simplified cross section of a schematic representation of an alternative embodiment of an example microelectronic device 100' having a patch 102 and an interposer 106. Microelectronic device 100' differs from microelectronic device 100 of FIG. 1A primarily in the following respects: the second embedded die 105' is of an example configuration including a vertical through contact 107 (which in some examples may be a characteristic of any or all embedded die within a substrate), such as a TSV through the die; and substrate 102 includes an additional lower surface vertical contact 114' extending to through contact 107 of embedded die 105'.

Addressing second embedded die 105', as with the first embedded die 104, second embedded die 105' may be either a bridge die or an active die, and can be of any desired configuration. Though first and second embedded die are depicted in FIGS. 1A and 1B, as will be apparent to persons skilled in the art, many more embedded die may be supported within patch 102. As noted above in this example, for purposes of illustration, second embedded die 105' includes an example vertical through contact 107. As will be apparent to persons skilled in the art, an embedded die may commonly include multiple vertical through contacts, at least some of which may be arranged in an array at a desired pitch relative to one another. The presence of a vertical through contact 107 may commonly result in the need for a lower surface vertical contact 114' extending to second embedded die 105' to facilitate connection to interposer 106' as shown.

It is noted that the thickness of the first embedded die 104 and the thickness of the second embedded die 105' are different. The thickness being a dimensional measure of an embedded die as assembled in the patch 102 in a direction perpendicular to either the top surface 112 or bottom surface 128. In addition to allowing a patch to accommodate embedded dies of differing thickness, the techniques discussed herein also allow for reduced bump top variation (BTV).

Figure 2G:
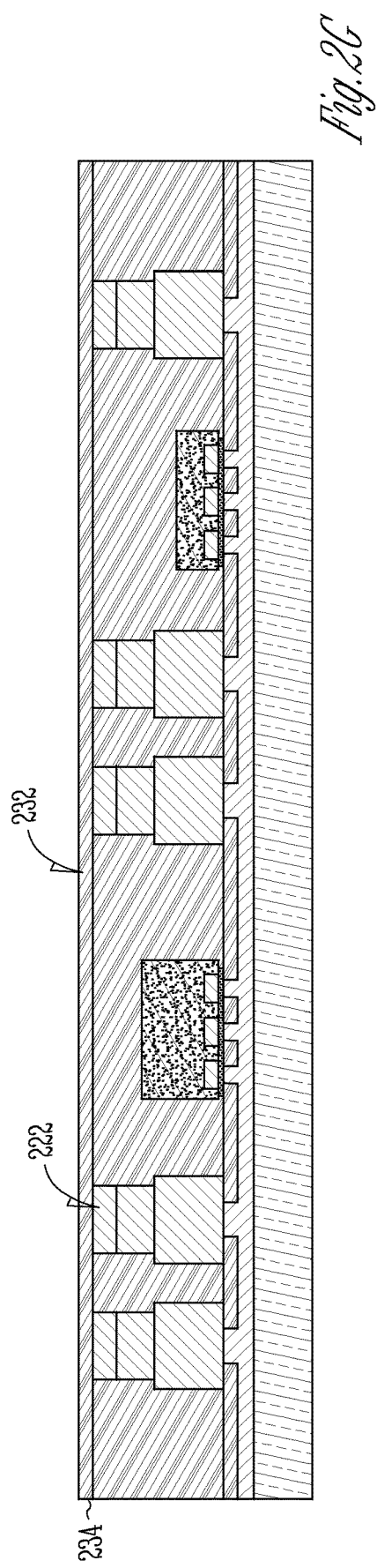
FIGS. 2A-2R illustrate generally simplified schematic representations of sequential representative stages in an example process for forming an example patch.
Figure 2H:
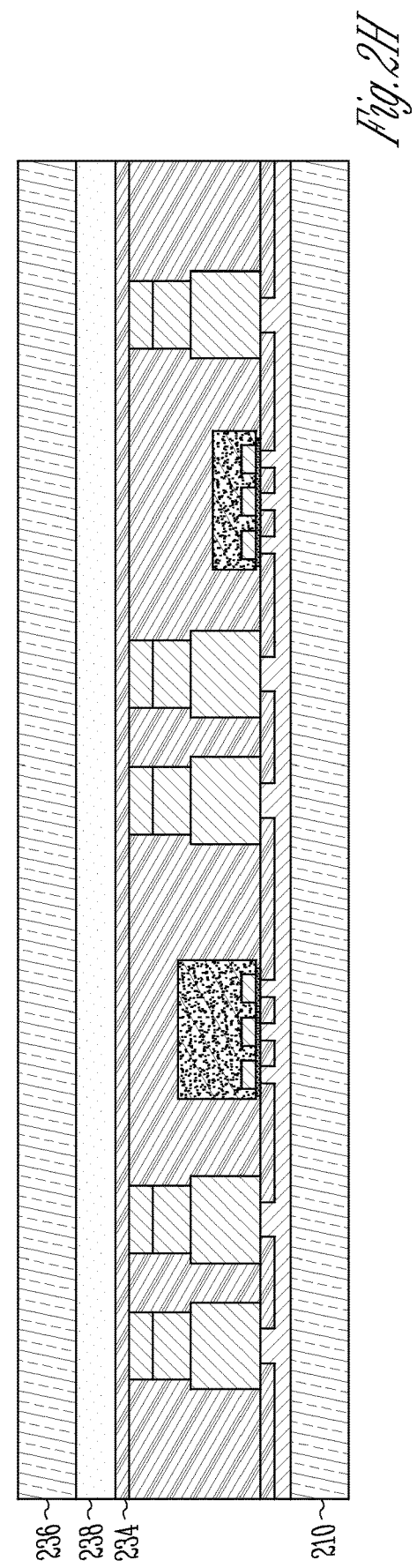
Figure 2Q:
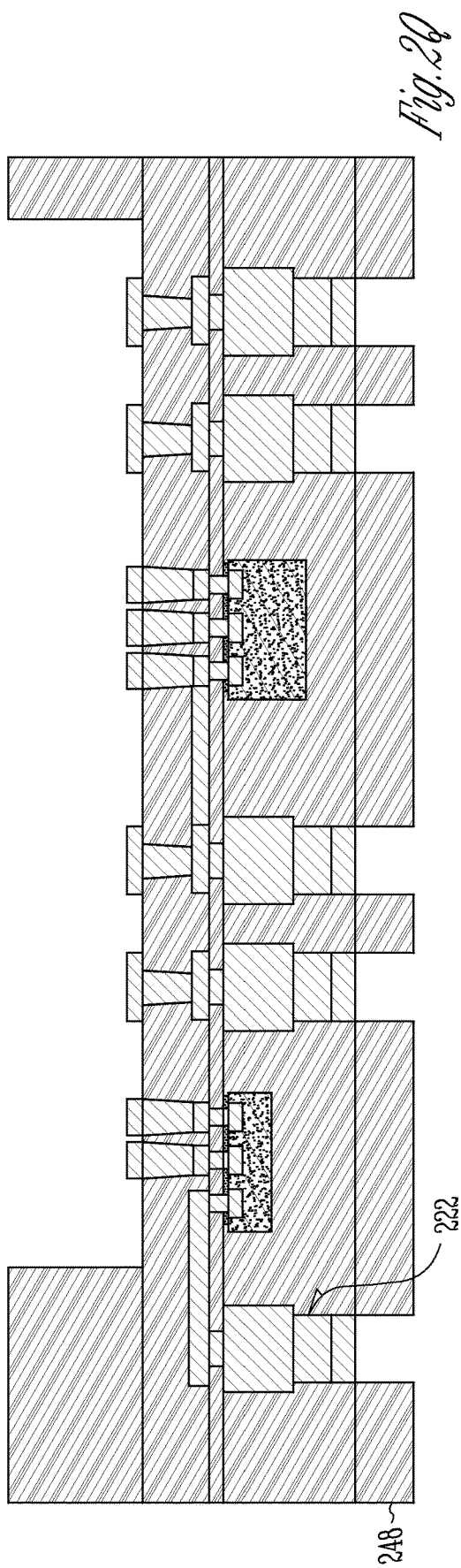
Figure 2R:
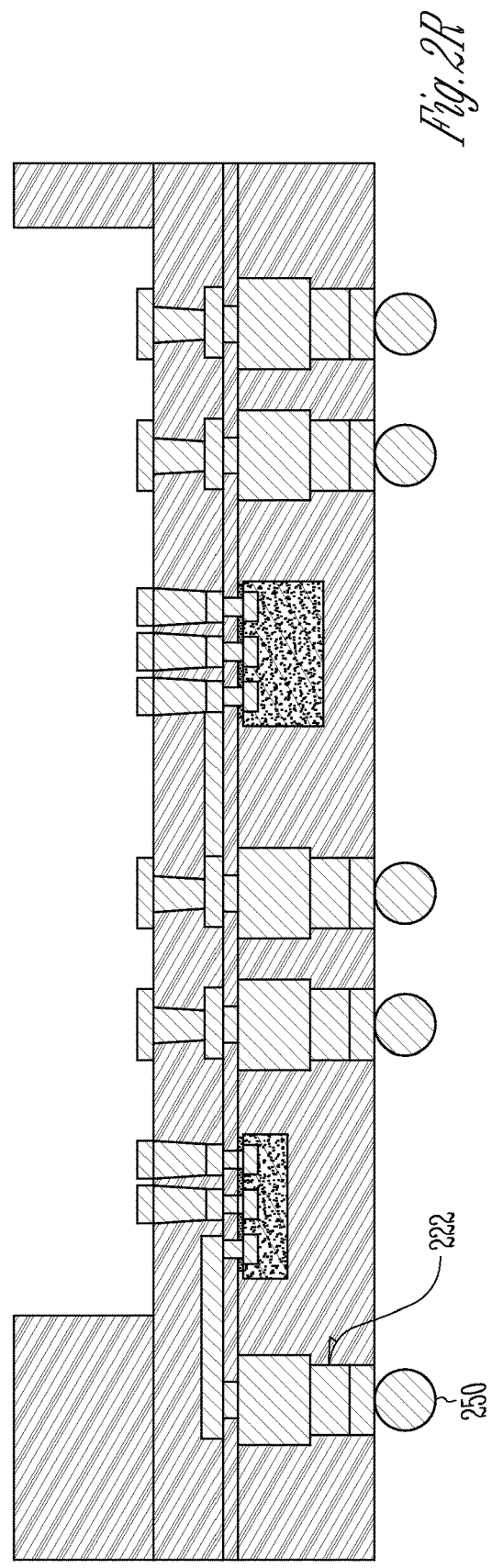

FIGS. 2A-2R illustrate generally simplified schematic representations of sequential representative stages in an example process for forming an example patch incorporating the techniques and structures described herein. As depicted in FIG. 2A, one or more initial patterned metallization layers 202 can be formed on a first carrier structure, indicated generally 210. In some examples, carrier structure 210 can include a support structure defining a planar support surface over which the patch may be formed. In some examples, carrier structure 210 may also include a release layer or other surface layer on the planar surface of the support structure. For purposes of the present example, a seed layer 206 can be deposited on the carrier structure 210.

The metallization layers 202 can be of any desired form for forming a temporary bottommost portion of vertical contacts (or other conductive structure) of the patch. The metallization layer 202 can be formed through desired processes known to those skilled in the art. For example, for many materials, a semi-additive process (SAP), may be used to form the patterned structures for these lower metallization layers 202.

The patch may include a dielectric body in which the embedded die is retained. In some examples, a first portion of the dielectric body may define an upper surface of the dielectric body, and a second portion of the dielectric body may extend to encapsulate or embed the embedded dies 104, 105. In some examples both the first portion of the dielectric body and the second portion may have planarized surfaces, as described below. Such planarized surfaces may be formed by grinding, chemical mechanical polishing CMP), or another known technique, also as described below.

Referring now to FIG. 2B, a dielectric layer 214 can be deposited over the structure of FIG. 2A to a dimension sufficient to cover metallization layer 202 as oriented in FIG. 2B. The dielectric layer 214 can be any of the materials as discussed above, including polyamide, polyimide, epoxy resins, etc., as discussed above. The dielectric layer 214 can be planarized and polished, such as through grinding, CMP, etc., to form a planarized surface 216. Thus, dielectric layer 214 forms the above-indicated first portion of the dielectric body of the patch that will be formed.

The planarization (or other planarization process) may be configured to stop at the surface of metallization layers 202 such that planar surface 216 is formed in part by exposed upper surfaces of metallization layers 202. The described formation of the first metallization layers 202 on the carrier prior to the forming of the dielectric layer offers significant advantages in many examples, in facilitating establishing a controlled dimension of the substrate above an embedded die, and providing a planar surface 216 for supporting the routing traces 126 and upper terminals of the patch.

Referring now to FIG. 2C, a second metallization layer/pillar 218 may be formed over at least some portion of patterned metallization layer 202. In many examples, second metallization layer/pillar 218 may be formed over the portions of metallization layers 202 to form portions of vertical contacts 222. If a portion of first metallization layers 202 were configured to be contacts for embedded dies, then second metallization layer/pillar 218 may not be formed over some or all of such portion of first metallization layers 202. Again, second metallization layer/pillar 218 may be formed through SAP process to leave a metallization pillar structure or vertical contact 222 only on selected portions of first metallization layer 202, as desired. In certain examples, metallization layer may be formed via multiple layering operations.

The formation of vertical contacts 222 through the use of multiple metallization layers facilitates building a patch control vertical dimension, and with vertical contacts 222 that are externally accessible, simplifying integration of the patch into a microelectronic device. In certain examples, a surface treatment layer may be formed of a desired metal, with a conductive contact material 212 formed thereon. Such a surface treatment layer may include one or more of nickel, tin-silver etc. In many examples, the conductive contact material 212 may be copper, though other conductive metals or alloys may be utilized.

Referring now to FIG. 2D, the embedded dies 204, 205 can be placed on planar surface 216 of dielectric layer 214 with the contacts of the embedded dies 204, 205 adjacent the first carrier structure 210. In some examples, a bonding layer 231 may be utilized to retain portions of the embedded dies 204, 205 in a fixed relation relative to planar surface 216 during further processing. As shown in FIG. 2E, additional dielectric 230 is then formed over the structure of FIG. 2D, in many examples to a dimension sufficient to completely encase both embedded dies 204 and 205 as well as vertical through contacts 222. Additional dielectric 230 may be formed as a single layer, or as multiple layers, as best suits the materials used for the layer. The forming of additional dielectric 230 around the embedded dies 204, 205 may be expected to result, in many examples, in a more uniform distribution of dielectric around the embedded dies 204, 205, pillars and other structures such that voids are minimized or eliminated.

Figure 3C:
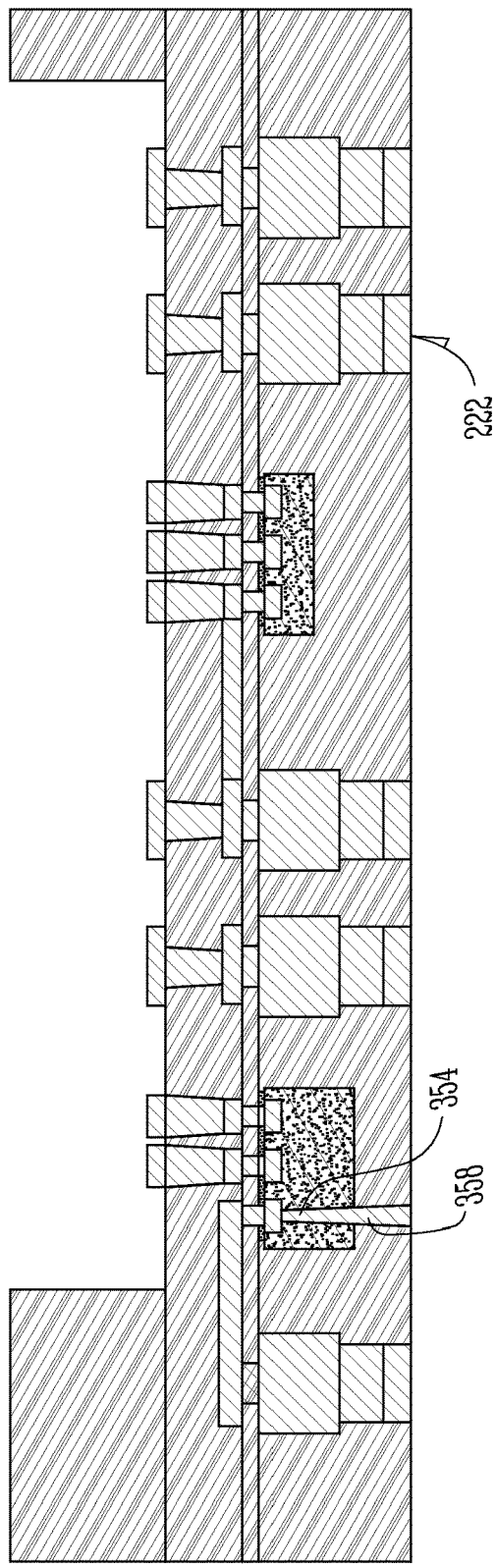
Figure 3D:
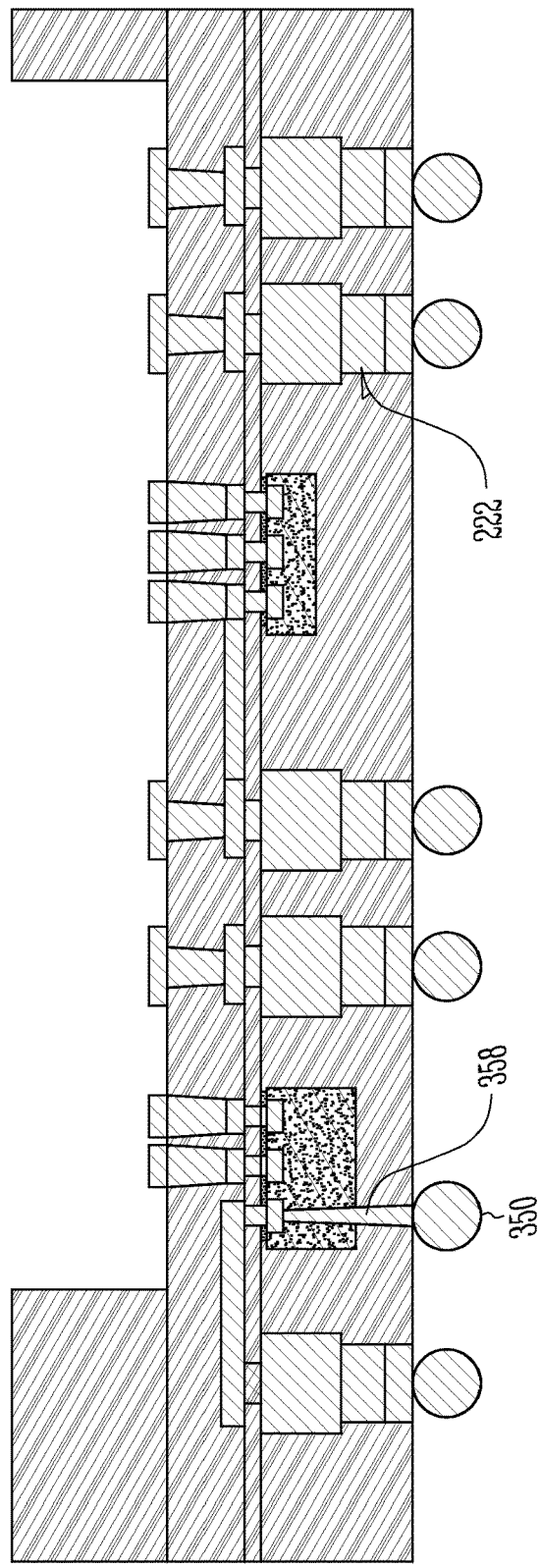

As shown in FIG. 2F, dielectric 230 is planarized, again such as through use of grinding, CMP or another known technique, to form a planar upper surface 232 which includes upper surfaces of through vertical contacts 222 (as orientated in FIG. 3G). As a result, dielectric 230 forms the identified second portion of the dielectric body of the patch.

Referring now to FIG. 2G, the exposed surfaces of the vertical contacts 222 can be protected by applying a layer of protective material 234 to the planar upper surface 232 of the dielectric body (as oriented in FIG. 2G). In certain examples, the protective material can be titanium (Ti) or other suitable material.

Referring to FIG. 2H, a second carrier structure 236 can be attached to the layer of protective material 234 currently atop the assembly. In certain examples, the second carrier structure 236 can include a glass carrier. In some examples, the second carrier structure 236 can include a layer of bonding material 238 such as an adhesive to attach the second carrier to the surface of the assembly. At FIG. 2I, the first carrier structure 210 can be removed from the assembly such as by, but not limited to, laser de-bonding, thermal or mechanical means or combinations thereof. At FIG. 2J, at least a portion, if not the entire initial metallization layers 214, can be removed using processes such as etching, for example. At FIG. 2K, the bond material 231 used to initially fix the embedded dies 204, 205 can be removed such as by dry etching, for example. At FIG. 2L, the assembly can be flipped and a conductive routing layer 240 can be fabricated to for example, connect contacts of the embedded dies 204, 205 with vertical contacts 222, or to provide connection pads for contacts of the embedded dies 204, 205 or vertical contacts 222.

At FIG. 2M an insulative layer 242 can be attached or formed to the exposed surfaces of the first portion 214 of the dielectric body and to the exposed surfaces of the conductive routing layer 240. The insulative layer 242 can further be etched or drilled to allow formation of exposed connections 244, 245 for the surface dies or other devices. In certain examples, the exposed connections 244, 245, for connection to the surface dies or other devices, can be arranged with a minimum pitch commensurate with a pitch of connection pads of the surface dies 108, 110 (FIG. 1) or bridge die 204, 205. In some examples, the first pitch can be on the order of 40 um or less. In certain examples, the first pitch can be on the order of 30 um or less. In certain examples, the material of the insulative layer 242 can include a solder resist.

At FIG. 2N, stiffeners 246 can be attached to the material of the insulative layer 242 to stiffen the patch assembly. At FIG. 2O, the second carrier structure 236 can be removed. In certain examples, a laser can be used to ablate the adhesive layer 238 attaching the second carrier structure 236 to the patch assembly. At FIG. 2P, the protective layer 234 can be removed to expose portions of the vertical contacts 222. FIGS. 2Q and 2R illustrate options for fabricating terminals of the patch for connecting to the interposer. At FIG. 2Q, an second insulative layer 248 can be attached to the underside of the patch assembly and can further be etch or drilled to expose retracted contact areas of the vertical contacts 222. At FIG. 2R, microballs 250 can be attached to the exposed portions of the vertical connectors 222.

FIGS. 3A-3D illustrate an alternative simplified schematic representations of sequential representative stages of an example process for forming a patch incorporating the techniques and structures described herein. The representative steps of FIGS. 2A-2P can precede the representative stage illustrated in FIG. 3A. At FIG. 3A, the exposed vertical connectors 222 or some other mark can provide a fiducial to locate and etch or drill an access opening 352 to a TSV 354 of one of the embedded dies 204. At FIG. 3B, a copper seed layer 356 and additional copper can be deposited within the opening 352 to extend an electrical connection of the TSV 354. At FIG. 3C, the excess copper can be removed to again expose the vertical contacts 222 including a vertical contact 358 of the TSV 354. At FIG. 3D, external terminals can be attached to the vertical connectors 222, 358. Such external terminals can include, but are not limited to, microballs 350.

Figure 4:
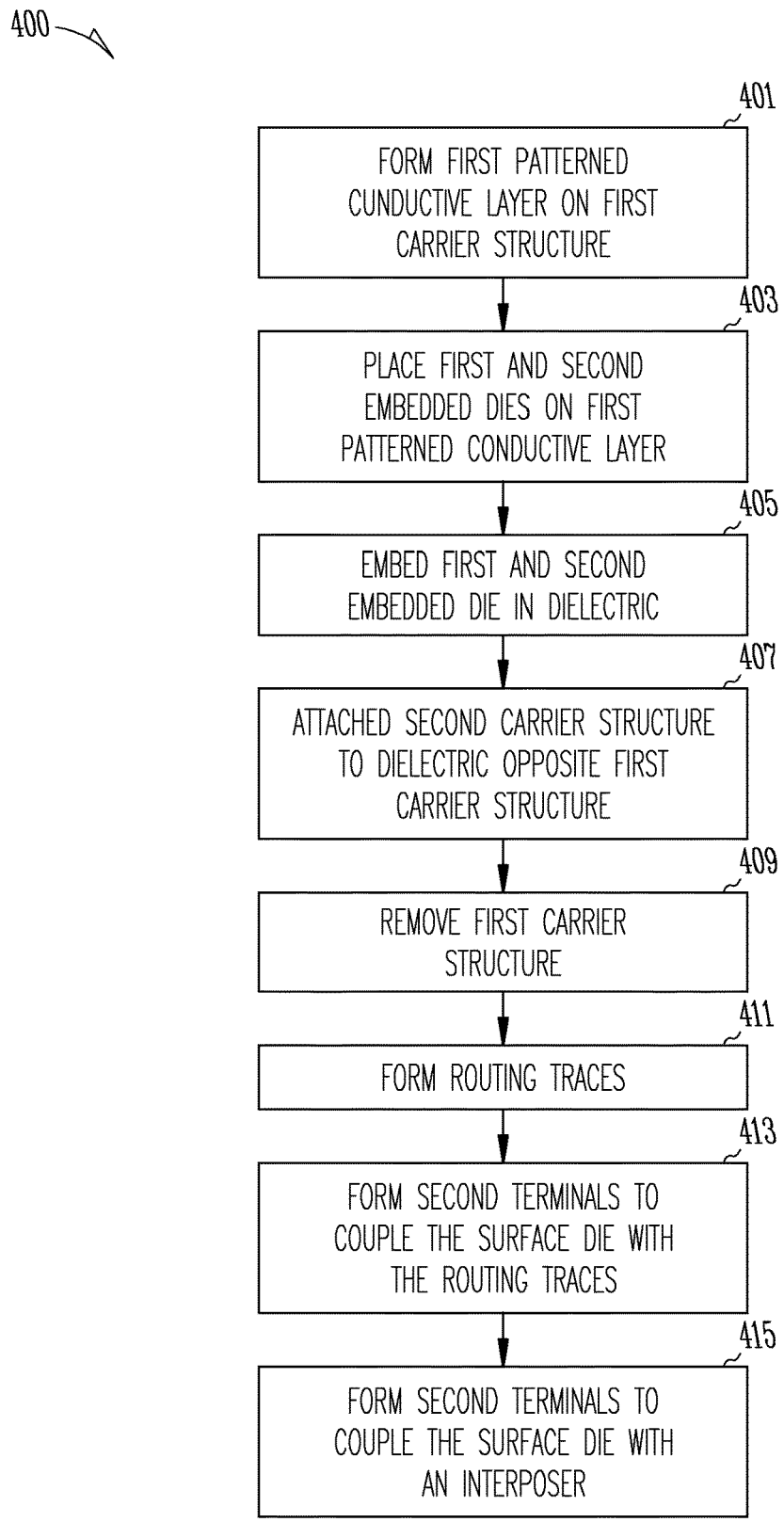
FIG. 4 illustrates generally a flowchart of an example method for fabricating a patch.

FIG. 4 illustrates generally a flowchart of an example method 400 for fabricating a patch. At 401, a first patterned conductive layer can be formed on a first carrier. The first carrier can be a dimensionally stable carrier such as a glass carrier. In certain examples, a dielectric can be formed over the patterned conductive layer and both the dielectric and the patterned conductive layer can be planarized and polished. In certain examples, conductive pillars can be formed on exposed portions of the first pattern conductive layer. Vertical contacts of the patch can include the conductive pillars. At 403, two or more dies can be placed on exposed portions of the first patterned conductive layer. In some examples, a holding material on the contacts of the dies can hold each die in place on the first patterned conductive layer. At 405, the dies can be embedded in a dielectric. In certain examples, the dielectric can be planarized to expose a top surface of the vertical contacts. In preparation for flipping the assembly, a protective material can be applied to the dielectric and the exposed surface of the vertical contacts. At 407, a second carrier structure can be coupled to the protective material, and at 409, the first carrier material can be removed. The carrier removal can be achieved by laser ablating the temporary bonding material of the carrier or other suitable method. At 411, the assembly can be flipped and a layer routing traces can replace the first patterned conductive layer. At 413, first terminals for connecting to one or more surface dies can be fabricated to connect to the routing traces. Such fabrication can include forming a solder resist to an upper side of the assembly opposite the second carrier. In some examples, stiffeners can be attached to the upper side of the assembly to maintain structural stiffness to the patch when the second carrier is removed. At 415, second terminals for connecting the patch, and the surface dies, to an interposer can be fabricated opposite the first terminals. The second carrier can be removed prior to forming the second terminals. The removal of the second carrier can be achieved by laser ablating the temporary bonding material of the carrier or other suitable method. The second terminals can be fabricated using a larger pitch than the first terminals.

The techniques described herein allow for efficient fabrication of a patch that can include two or more embedded dies of varying thickness while also maintaining relatively small BTV. Packages fabricated using the above techniques can be used in PoINT-type architectures for bump pitches of 30 um and below. Because the thickness of the embedded dies can vary, use of active dies embedded within the patch can open a multitude of applications while also providing excellent yields compared to conventional patch apparatus and methods.

Figure 5:
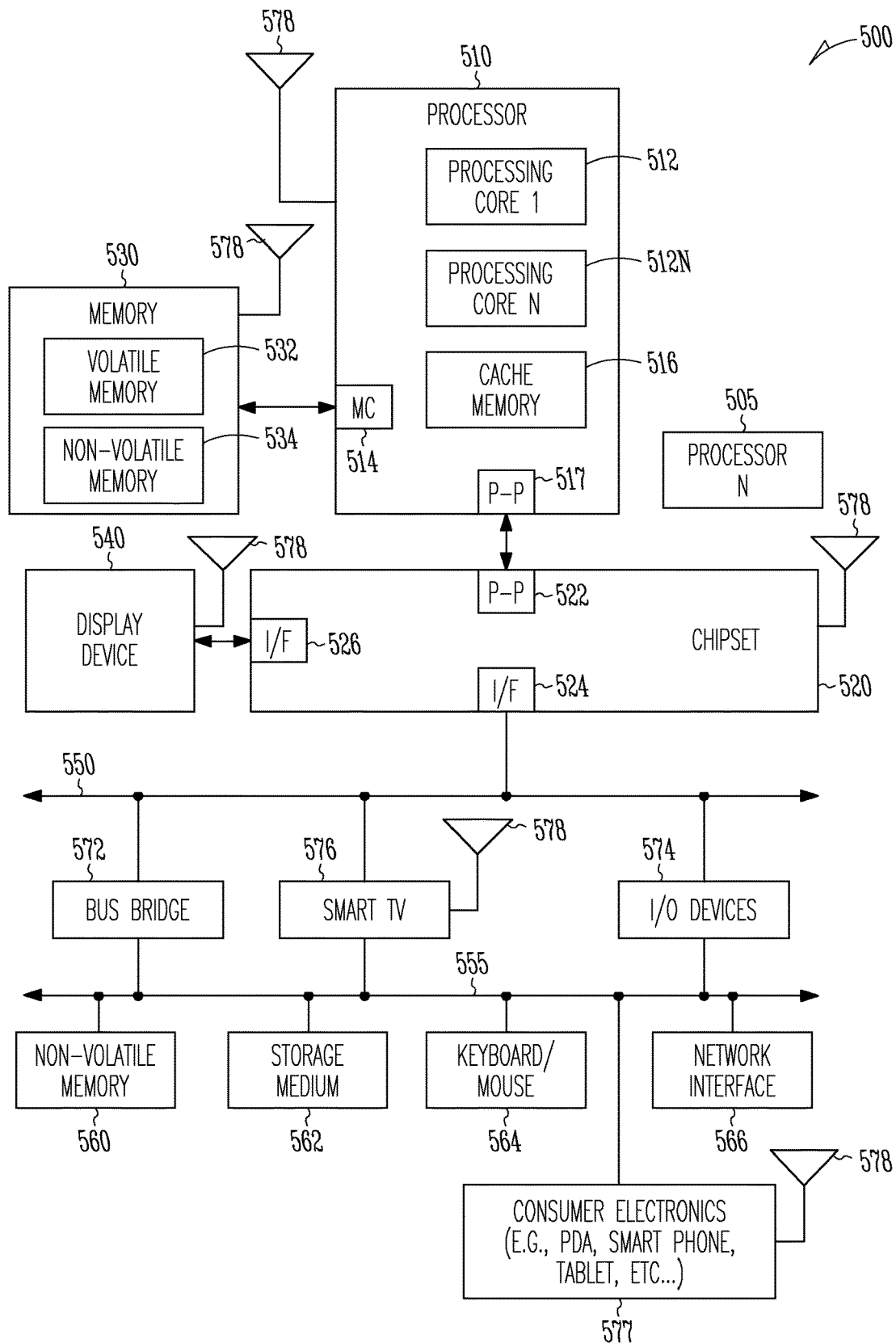
FIG. 5 depicts a system level diagram of an electronic system which may incorporate an embedded die microelectronic device such as any of the microelectronic devices as described herein.

FIG. 5 illustrates a system level diagram, according to one embodiment of the invention. For instance, FIG. 5 depicts an example of an electronic device (e.g., system) including the microelectronic device embedded die package constructed as described herein. As noted above, the embedded die package having the molded component providing a planar surface independent of the contours of an underlying substrate are able to provide higher-yielding packages for incorporation into such systems. FIG. 5 is included to show an example of a higher level device application for the present invention. In one embodiment, system 500 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 500 is a system on a chip (SOC) system.

In one embodiment, processor 510 has one or more processing cores 512 and 512N, where 512N represents the Nth processor core inside processor 510 where N is a positive integer. In one embodiment, system 500 includes multiple processors including 510 and 505, where processor 505 has logic similar or identical to the logic of processor 510. In some embodiments, processing core 512 includes, but is not limited to, pre-fetch logic to fetch instructions, decode logic to decode the instructions, execution logic to execute instructions and the like. In some embodiments, processor 510 has a cache memory 516 to cache instructions and/or data for system 500. Cache memory 516 may be organized into a hierarchal structure including one or more levels of cache memory.

In some embodiments, processor 510 includes a memory controller 514, which is operable to perform functions that enable the processor 510 to access and communicate with memory 530 that includes a volatile memory 532 and/or a non-volatile memory 534. In some embodiments, processor 510 is coupled with memory 530 and chipset 520. Processor 510 may also be coupled to a wireless antenna 578 to communicate with any device configured to transmit and/or receive wireless signals. In one embodiment, the wireless antenna interface 578 operates in accordance with, but is not limited to, the IEEE 802.11 standard and its related family, Home Plug AV (HPAV), Ultra-Wide Band (UWB), Bluetooth, WiMAX, or any form of wireless communication protocol.

In some embodiments, volatile memory 532 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 534 includes, but is not limited to, flash memory, phase change memory (PCM), read-only memory (ROM), electrically erasable programmable read-only memory (EEPROM), or any other type of non-volatile memory device.

Memory 530 stores information and instructions to be executed by processor 510. In one embodiment, memory 530 may also store temporary variables or other intermediate information while processor 510 is executing instructions. In the illustrated embodiment, chipset 520 connects with processor 510 via Point-to-Point (PtP or P-P) interfaces 517 and 522. Chipset 520 enables processor 510 to connect to other elements in system 500. In some embodiments of the invention, interfaces 517 and 522 operate in accordance with a PtP communication protocol such as the Intel® QuickPath Interconnect (QPI) or the like. In other embodiments, a different interconnect may be used.

In some embodiments, chipset 520 is operable to communicate with processor 510, 505N, display device 540, and other devices 572, 576, 574, 560, 562, 564, 566, 577, etc. Chipset 520 may also be coupled to a wireless antenna 578 to communicate with any device configured to transmit and/or receive wireless signals.

Chipset 520 connects to display device 540 via interface 526. Display 540 may be, for example, a liquid crystal display (LCD), a plasma display, cathode ray tube (CRT) display, or any other form of visual display device. In some embodiments of the invention, processor 510 and chipset 520 are merged into a single SOC. In addition, chipset 520 connects to one or more buses 550 and 555 that interconnect various elements 574, 560, 562, 564, and 566. Buses 550 and 555 may be interconnected together via a bus bridge 572. In one embodiment, chipset 520 couples with a non-volatile memory 560, a mass storage device(s) 562, a keyboard/mouse 564, a network interface 566, a smart TV 576, consumer electronics 577, etc., via interface 524.

In one embodiment, mass storage device 562 includes, but is not limited to, a solid state drive, a hard disk drive, a universal serial bus flash memory drive, or any other form of computer data storage medium. In one embodiment, network interface 566 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMAX, or any form of wireless communication protocol.

While the modules shown in FIG. 5 are depicted as separate blocks within the system 500, the functions performed by some of these blocks may be integrated within a single semiconductor circuit or may be implemented using two or more separate integrated circuits. For example, although cache memory 516 is depicted as a separate block within processor 510, cache memory 516 (or selected aspects of 516) can be incorporated into processor core 512.

Additional Notes and Examples

In Example 1, a method of making a multi-die patch can include forming a first patterned conductive layer defining multiple contact pads on a first carrier structure, placing a first die on a first plurality of contact pads of the multiple contact pads, placing a second die on a second plurality of contact pads of the multiple contact pads, embedding the first die and the second die in a dielectric disposed on the patterned conductive layer, attaching a second carrier structure to the dielectric on a surface of the dielectric opposite the first carrier, removing the first carrier structure, forming routing traces, the routing traces configured to electrically couple the first and second die with one or more surface die, forming first terminals connected with a first plurality of routing traces of the routing traces, the first terminals exposed at a first side of the dielectric, and forming second terminals connected with a second plurality of routing traces of the routing traces, the second terminals exposed at a second side of the dielectric, the second side opposite the first side.

In Example 2, a thickness of the first die of Example 1 optionally is different than the thickness of the second die.

In Example 3, the forming second terminals of any one or more of Examples 1-2 optionally includes removing the second carrier structure.

In Example 4, the removing the second carrier structure of any one or more of Examples 1-3 optionally includes laser ablating an adhesive layer of the second carrier structure.

In Example 5, the removing the second carrier structure of any one or more of Examples 1-4 optionally includes coupling a stiffener to the first side before removing the second carrier structure.

In Example 6, the forming a patterned conductive layer of any one or more of Examples 1-5 optionally includes depositing a copper layer on a first carrier, and etching the multiple contact pads in the first copper layer.

In Example 7, the method of any one or more of Examples 1-6 optionally includes laminating a first portion of the dielectric to the patterned conductive layer, and polishing the first portion of the dielectric.

In Example 8, the method of any one or more of Examples 1-7 optionally includes forming a plurality of vertical contacts extending from a third plurality of contact pads of the multiple contact pads to the second side.

In Example 9, the embedding the first die and the second die in a dielectric of any one or more of Examples 1-8 optionally includes embedding the vertical contacts in the dielectric.

In Example 10, the embedding the first die and the second die in a dielectric of any one or more of Examples 1-9 optionally includes planarizing the dielectric to expose the vertical contacts.

In Example 11, the embedding the first die and the second die in a dielectric of any one or more of Examples 1-10 optionally includes sputtering a protective layer over exposed portions of the vertical contacts.

In Example 12, the first carrier structure of any one or more of Examples 1-11 optionally includes a glass carrier.

In Example 13, the second carrier structure of any one or more of Examples 1-12 optionally includes a glass carrier.

In Example 14, the forming first terminals of any one or more of Examples 1-13 optionally includes replacing at least a portion of the first patterned conductive layer with a second patterned conductive layer.

In Example 15, the forming first terminals optionally includes attaching a solder resist material to the second patterned conductive layer, etching vias in the solder resist layer; and filling the vias with conductive material to form the first terminals.

In Example 16, the forming first terminals of any one or more of Examples 1-15 optionally includes etching at least a portion of the first patterned conductive layer after the first carrier structure is removed.

In Example 17, the forming first terminals of any one or more of Examples 1-16 optionally includes etching an attachment material from contacts of at least one of the first embedded die or the second embedded die.

In Example 18, at least a portion of the first terminals to the first and second embedded dies of any one or more of Examples 1-17 optionally are arranged in a first pitch relative to one another, and wherein at least a portion of the second terminals are arranged at a second pitch relative to one another, and wherein the first pitch is narrower than the second pitch.

In Example 19, a patch configured to electrically interconnect a first surface die with a second surface die and to interconnect at least one of the first surface die or the second surface die with an interposer or other device can include a dielectric, first terminals exposed on a first side of the dielectric, second terminals disposed in the dielectric and exposed on a second side of the dielectric, the second terminals configured to couple with the interposer, the second side opposite the first side, a first embedded die embedded in the dielectric and coupled to a first plurality of the first terminals, and a second embedded die embedded in the dielectric and coupled to a second plurality of the first terminals, and wherein a thickness of the first embedded die is different than a thickness of the second embedded die.

In Example 20, the patch of any one or more of Examples 1-19 optionally includes traverse routing traces configured to electrically couple at least one of the first terminals with a terminal of at least one of the first embedded die or the second embedded die.

In Example 21, the first embedded die of any one or more of Examples 1-20 optionally is a bridge die.

In Example 22, the first embedded die of any one or more of Examples 1-21 optionally is an active die.

In Example 23, the second embedded die of any one or more of Examples 1-22 optionally is a bridge die.

In Example 24, the second embedded die of any one or more of Examples 1-23 optionally is an active die.

In Example 25, the patch of any one or more of Examples 1-24 optionally includes a plurality of vertical contacts extending through the dielectric from the second terminals.

In Example 26, at least one of the first embedded die or the second embedded die of any one or more of Examples 1-25 optionally includes one or more through silicon vias.

In Example 27, the dielectric of any one or more of Examples 1-26 optionally comprises at least one contact extending from the second surface of the substrate to a respective through silicon via of the at least one of the first embedded die or the second embedded die.

In Example 28, at least a portion of the first terminals of any one or more of Examples 1-27 optionally are arranged in a first pitch relative to one another, wherein at least a portion of the through second terminals are arranged at a second pitch relative to one another, and wherein the first pitch is narrower than the second pitch.

In Example 29, a microelectronic device can include a patch housing at least a first embedded die and a second embedded die, the patch comprising through contacts extending from a first surface of the patch to an opposing second surface of the patch, and contacts extending from a first surface to the first embedded die, the patch having a layer of transverse routing traces. The microelectronic device further including at least one surface die retained above the first surface of the patch, the surface die electrically coupled to one or more of the contacts of the patch, an interposer retained proximate a second surface of the patch, the interposer having a first set of multiple interposer contacts on a first surface, the first set of multiple interposer contacts coupled to respective patch contacts, the interposer containing multiple conductive metal layers redistributing contacts of the first set of multiple interposer contacts to respective locations on an opposing second surface of the interposer; and wherein a thickness of the first embedded die is different than a thickness of the second embedded die.

In Example 30, the patch of any one or more of Examples 1-29 optionally comprises a single layer of transverse routing traces.

In Example 31, the single layer of transverse routing traces of any one or more of Examples 1-30 optionally is proximate a surface of the patch.

In Example 32, the single layer of transverse routing traces of any one or more of Examples 1-31 optionally is proximate the first surface of the patch.

In Example 33, the single layer of transverse routing traces of any one or more of Examples 1-32 optionally is formed internal to the patch.

In Example 34, the first embedded die of any one or more of Examples 1-33 optionally is a bridge die.

In Example 35, the first embedded die of any one or more of

Examples 1-34 optionally is an active die.

In Example 36, the microelectronic device of any one or more of Examples 1-35 optionally includes multiple contact surfaces proximate the second surface.

In Example 37, at least a portion of the through contacts in the patch of any one or more of Examples 1-36 optionally extend to the contact surfaces proximate the second surface.

In Example 38, the multiple contact surfaces proximate the second surface of any one or more of Examples 1-37 optionally are generally flush with the second surface.

In Example 39, the patch optionally comprises a dielectric body in which the embedded die is retained.

In Example 40, the dielectric body of any one or more of Examples 1-39 optionally comprises a first portion extending beneath the embedded die, wherein the first portion has a first planarized surface proximate the embedded die.

In Example 41, the first planarized surface of any one or more of Examples 1-40 optionally is formed by grinding or chemical mechanical planarization.

In Example 42, the first planarized surface of any one or more of Examples 1-41 optionally is formed at a level of a first metallization layer of the patch.

In Example 43, the dielectric body of any one or more of Examples 1-42 optionally comprises a second portion extending above the first portion and above the first and second embedded dies.

In Example 44, at least a portion of the through contacts of any one or more of Examples 1-43 optionally are arranged at a first pitch relative to one another, and wherein at least a portion of the contacts to the first embedded die are arranged in a second pitch relative to one another, wherein the second pitch is narrower than the first pitch.

In Example 45, the embedded die of any one or more of Examples 1-44 optionally is completely encased within the patch, and is supported in spaced relation relative to the first surface.

In Example 46, the patch of any one or more of Examples 1-45 optionally comprises multiple layers of laminations.

In Example 47, at least one of the first embedded die or the second embedded die of any one or more of Examples 1-46 optionally includes one or more through silicon vias.

In Example 48, the patch of any one or more of Examples 1-47 optionally comprises at least one contact extending from the second surface of the patch to a respective through silicon via of the embedded die.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "where." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A method of making a multi-die patch, the method comprising:
    forming a first patterned conductive layer defining multiple contact pads on a first carrier structure;
    placing a first die on a first plurality of contact pads of the multiple contact pads;
    placing a second die on a second plurality of contact pads of the multiple contact pads;
    embedding the first die and the second die in a dielectric disposed on the first patterned conductive layer;
    attaching a second carrier structure to the dielectric on a surface of the dielectric opposite the first carrier;
    removing the first carrier structure;
    forming routing traces, the routing traces configured to electrically couple the first and second die with one or more surface die;
    forming first terminals connected with a first plurality of routing traces of the routing traces, the first terminals exposed at a first side of the dielectric, wherein the forming first terminals includes replacing at least a portion of the first patterned conductive layer with a second patterned conductive layer; and
    forming second terminals connected with a second plurality of routing traces of the routing traces, the second terminals exposed at a second side of the dielectric, the second side opposite the first side.

2. The method of claim 1, wherein a thickness of the first die is different than the thickness of the second die.

3. The method of claim 1, wherein the forming second terminals includes removing the second carrier structure.

4. The method of claim 3, wherein removing the second carrier structure includes laser ablating an adhesive layer of the second carrier structure.

5. The method of claim 3, wherein removing the second carrier structure includes coupling a stiffener to the first side before removing the second carrier structure.

6. The method of claim 1, wherein the forming a patterned conductive layer includes:
depositing a copper layer on a first carrier; and
etching the multiple contact pads in the first copper layer.

7. The method of claim 6, including:
laminating a first portion of the dielectric to the patterned conductive layer; and
polishing the first portion of the dielectric.

8. The method of claim 1, including forming a plurality of vertical contacts extending from a third plurality of contact pads of the multiple contact pads to the second side.

9. The method of claim 8, wherein the embedding the first die and the second die in a dielectric includes embedding the vertical contacts in the dielectric.

10. The method of claim 9, wherein the embedding the first die and the second die in a dielectric includes planarizing the dielectric to expose the vertical contacts.

11. The method of claim 10, wherein the embedding the first die and the second die in a dielectric includes sputtering a protective layer over exposed portions of the vertical contacts.

12. The method of claim 1, wherein the first carrier structure includes a glass carrier.

13. The method of claim 1, wherein the second carrier structure includes a glass carrier.

14. The method of claim 1, wherein the forming first terminals includes:
attaching a solder resist material to the second patterned conductive layer;
etching vias in the solder resist layer; and
filling the vias with conductive material to form the first terminals.

15. The method of claim 1, wherein the forming first terminals includes etching at least a portion of the first patterned conductive layer after the first carrier structure is removed.

16. The method of claim 15, wherein the forming first terminals includes etching an attachment material from contacts of at least one of the first embedded die or the second embedded die.

17. The method of claim 1, wherein at least a portion of the first terminals to the first and second embedded dies are arranged in a first pitch relative to one another, and wherein at least a portion of the second terminals are arranged at a second pitch relative to one another, and wherein the first pitch is narrower than the second pitch.

18. A patch configured to electrically interconnect a first surface die with a second surface die and to interconnect at least one of the first surface die or the second surface die with an interposer or other device, the patch comprising:
a dielectric;
first terminals exposed on a first side of the dielectric;
second terminals disposed in the dielectric and exposed on a second side of the dielectric, the second terminals configured to couple with the interposer, the second side opposite the first side;
a first embedded die embedded in the dielectric and coupled to a first plurality of the first terminals, the first embedded die having an uppermost surface and a bottommost surface, wherein a first portion of the dielectric is on the bottommost surface of the first embedded die, the first portion of the dielectric having a thickness; and
a second embedded die embedded in the dielectric and coupled to a second plurality of the first terminals, the second embedded die having an uppermost surface and a bottommost surface, wherein a second portion of the dielectric is on the bottommost surface of the second embedded die, the second portion of the dielectric having a thickness different than the thickness of the first portion of the dielectric; and
wherein a thickness of the first embedded die is different than a thickness of the second embedded die, wherein the uppermost surface of the first embedded die is at a same level as the uppermost surface of the second embedded die, wherein the dielectric does not extend vertically over the uppermost surface of the first embedded die, and the dielectric does not extend vertically over the uppermost surface of the second embedded die, and wherein one of the first embedded die or the second embedded die is electrically connected to and vertically overlapping with both of the first surface die and the second surface die by a plurality of vertical conductive plugs, the plurality of vertical conductive plugs extending to a top surface of the one of the first embedded die or the second embedded die.

19. The patch of claim 18, including traverse routing traces configured to electrically couple at least one of the first terminals with a terminal of at least one of the first embedded die or the second embedded die.

20. The patch of claim 18, wherein the first embedded die is a bridge die.

21. The patch of claim 18, wherein the first embedded die is an active die.

22. The patch of claim 18, wherein the second embedded die is a bridge die.

23. The patch of claim 18, wherein the second embedded die is an active die.

24. The patch of claim 18, wherein at least one of the first embedded die or the second embedded die includes one or more through silicon vias.

* * * * *